United States Patent [19]

Jiang et al.

[11] Patent Number: 5,757,829
[45] Date of Patent: May 26, 1998

[54] FLIP CHIP POWER MONITORING SYSTEM FOR VERTICAL CAVITY SURFACE EMITTING LASERS

[75] Inventors: Wenbin Jiang, Phoenix; Michael S. Lebby, Apache Junction, both of Ariz.

[73] Assignee: Motorola, Inc., Schaumburg, Ill.

[21] Appl. No.: 638,658

[22] Filed: Apr. 29, 1996

[51] Int. Cl.$^6$ .................. H01S 3/13; H01S 3/19; H01S 3/08; H01S 3/00
[52] U.S. Cl. .................. 372/31; 372/45; 372/96; 372/33
[58] Field of Search .................. 372/50, 43, 44, 372/45, 46, 96, 99, 29, 33, 31

[56] References Cited

U.S. PATENT DOCUMENTS

| | | |
|---|---|---|
| 5,136,603 | 8/1992 | Hasnain et al. .................. 372/50 |
| 5,301,201 | 4/1994 | Dutta et al. .................. 372/43 |
| 5,577,064 | 11/1996 | Swirhun et al. .................. 372/50 |
| 5,606,572 | 2/1997 | Swirhun et al. .................. 372/31 |

Primary Examiner—Rodney B. Bovernick
Assistant Examiner—Luong-Quyen T. Phan
Attorney, Agent, or Firm—Eugene A. Parsons

[57] ABSTRACT

A power monitoring system including a first substrate having a first vertical cavity surface emitting laser and a second vertical cavity surface emitting laser formed thereon and being generally identical. A second substrate having a photodiode formed thereon. The second substrate is flip chip mounted on the first substrate with the photodiode in optical alignment the second vertical cavity surface emitting laser. The output of the photodiode is used to control emissions of the first and second vertical cavity surface emitting lasers.

9 Claims, 2 Drawing Sheets

FLIP CHIP POWER MONITORING SYSTEM FOR VERTICAL CAVITY SURFACE EMITTING LASERS

FIELD OF THE INVENTION

The present invention pertains to vertical cavity surface emitting lasers.

More particularly, the present invention pertains to power monitoring of vertical cavity surface emitting lasers.

Further and more specifically, the present invention pertains to auto power controlled vertical cavity surface emitting lasers.

BACKGROUND OF THE INVENTION

Since the development of laser diodes, many applications for their use have been developed. Increasingly, laser diodes are employed for communications and are integral to optical disc recording and storage systems. Typically, edge emitting diode lasers are used. Edge emitting diode lasers, however, have a high cost in parallel and serial data links, and have a high current drain due to a high threshold current when used in compact disc pickups.

New systems are being developed to employ vertical cavity surface emitting lasers (VCSEL) in place of edge emitting lasers. The VCSELs provide a much lower cost, use surface emissions which simplify optical devices and are capable of being fabricated in larger volumes on semiconductor wafers. However, during use, temperature fluctuations and degradation of the VCSEL device cause fluctuations in the emissions. These fluctuations cause errors in data retrieval and furthermore the threshold level may increase, thereby requiring more power input to sustain lasing. Edge emitting laser diodes employ a power monitoring detector facing the back emission facet of the device. In a VCSEL, there are no back emissions due to the construction of the mirror stacks and the opaque substrate on which the device is necessarily formed.

It would be highly advantageous, therefore, to remedy the foregoing and other deficiencies inherent in the prior art.

Therefore it is desirable that a system be developed for monitoring the emissions of a VCSEL.

Accordingly, it is an object of the present invention to provide a power monitoring system for a VCSEL.

Another object of the present invention is to provide a power monitoring system which will automatically control the emissions.

And another object of the present invention is to provide an inexpensive and easily fabricated power monitor system and automatic power control.

SUMMARY OF THE INVENTION

Briefly, to achieve the desired objects of the instant invention, in accordance with a preferred embodiment thereof, provided is a power monitoring system including a first vertical cavity surface emitting laser generating a first emission, and a second vertical cavity surface emitting laser generating a second emission, generally identical to the first emission. A monitor is mounted to receive the second emission from the second vertical cavity surface emitting laser.

In another embodiment, a power monitoring system is provided which includes a first substrate having a first vertical cavity surface emitting laser and a second vertical cavity surface emitting laser formed thereon and generally identical. A second substrate having a photodiode formed thereon is flip chip mounted on the first substrate with the photodiode in optical alignment with the second vertical cavity surface emitting laser.

In accordance with a further embodiment of the invention, a method of fabricating a power monitoring system is provided, including the steps of providing a first substrate and forming a first vertical cavity surface emitting laser and a second vertical cavity surface emitting laser thereon with generally identical characteristics. Providing a second substrate and forming a photodiode thereon. The second substrate is flip chip mounted on the first substrate such that the photodiode is in optical alignment with the second vertical cavity surface emitting laser.

BRIEF DESCRIPTION OF THE DRAWINGS

The foregoing and further and more specific objects and advantages of the instant invention will become readily apparent to those skilled in the art from the following detailed description of preferred embodiments thereof taken in conjunction with the drawings in which.

DETAILED DESCRIPTION OF THE PREFERRED EMBODIMENT

Figure 1:
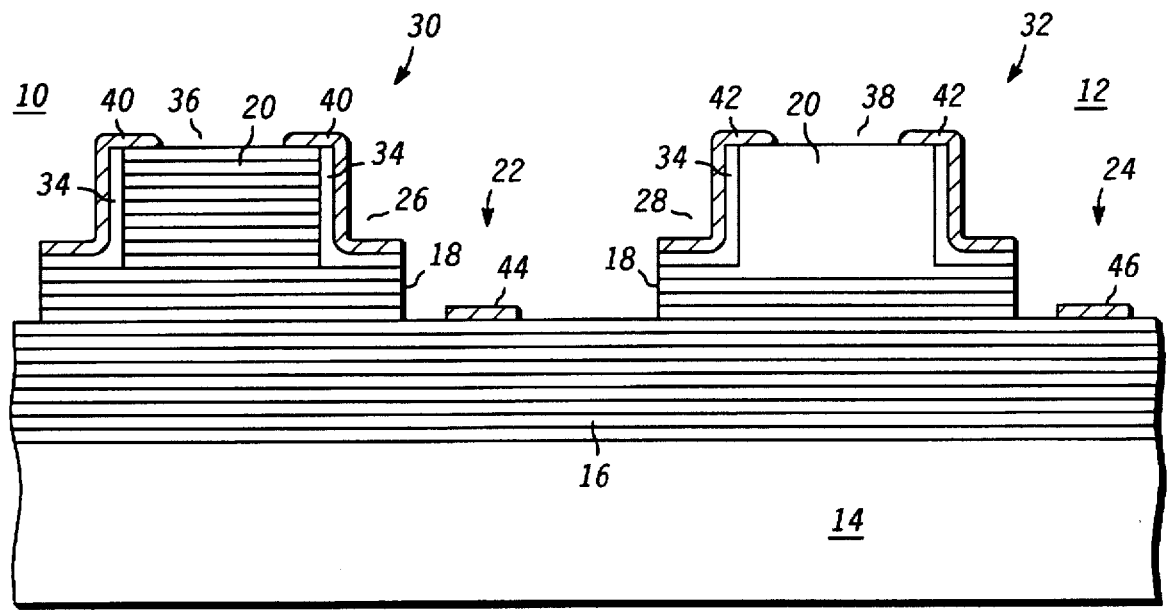
FIG. 1 is a simplified cross-sectional view of a vertical cavity surface emitting laser.

Turning now to the drawings in which like reference characters indicate corresponding elements throughout the several views, attention is first directed to FIG. 1 which illustrates a pair of vertical cavity surface emitting lasers (VCSEL) generally designated 10 and 12 formed on a common substrate 14. Specific VCSELs 10 and 12 are illustrated only for purposes of this disclosure and it should be understood that many different types of VCSEL might be utilized, including planar, ridge, completely etched from the substrate, etc. In this embodiment VCSELs 10 and 12 are fabricated by epitaxially growing a first mirror stack 16 on the top surface of substrate 14. Mirror stack 16 includes a plurality of layers of semiconductor material with alternating indexes of refraction. Some examples of materials that can be used for this purpose are: alternating layers of $Al_{0.15}Ga_{0.85}As$ and $Al_{0.80}Ga_{0.20}As$; alternating layers of GaAs and $Al_{0.80}Ga_{0.20}As$; etc. Each pair of alternating layers are grown to a thickness of one quarter of the emission wavelength, propagating in the layers, and the number of pairs is chosen to provide as much reflectivity of light as possible while limiting the stack to a practical number. An active region 18 is grown on the upper surface of mirror stack 16, which includes one or more quantum wells separated by barrier layers with a spacer and/or cladding layer on either side thereof. The quantum wells and spacer layers are also grown epitaxially.

A second mirror stack 20 is formed on the upper surface of active region 18 by, for example, epitaxially growing pairs of semiconductor layers as described in conjunction with mirror stack 16. Generally, the pairs of layers will be formed of materials similar to those of mirror stack 16 and the thicknesses will be similar to provide the proper reflectivity of a selected wavelength or spectrum of wavelengths. Also, first and second mirror stacks 16 and 20 are doped with opposite conductivity types to form a two terminal (diode) structure for the flow of electrical current therethrough.

VCSELs 10 and 12 are defined by etching a trench 22 through second mirror stack 20 and active region 18 to separate VCSELs 10 and 12 and a trench 24 is similarly etched to define an outer boundary thereof. Trenches 22 and 24 expose an upper surface of first mirror stack 16 so that an electrical contact can be made to mirror stack 16. It should be noted that this is simply one method of providing electrical contact to the lower mirror stack and a second method is to place an electrical contact on the lower surface of substrate 14. VCSELs 10 and 12 are further defined by patterning the structure as follows. The upper surface of mirror stack 20 is provided with a layer of photoresist alone or in combination with oxynitride material in any of the well known methods. The photo resist layer is exposed and material is removed to define the position and size of a trench 26 and a trench 28. Trenches 26 and 28 are then formed by etching mirror stack 20 by any convenient means such as, ion milling, dry etching, wet etching, etc. In general, trench 26 extends completely around and defines an operating area, or mesa 30 for VCSEL 10 and in a similar fashion, trench 28 defines an operating area, or mesa 32 for VCSEL 12. Generally operating areas, or mesas 30 and 32 have a circular cross-section.

In this specific embodiment trenches 26 and 28 extend into mirror stack 20 from the upper surface thereof, approximately to the active region 18. While this depth is convenient for current limiting and etching techniques, it is only necessary that trenches 26 and 28 be sufficiently deep to confine the current to the active region and to reduce reflectivity of mirror stack 20 in the volume between the bottom of trench 26 or 28 and active layer 18 so that a non-lasing volume is produced beneath trenches 26 and 28. The non-lasing volume surrounds a lasing volume below each of mesas 30 and 32, which lasing volumes are each substantially coaxial with mesas 30 and 32. In at least some applications lasing will not be supported when the reflectivity is reduced to less than approximately 98%. A complete disclosure of the construction of ridge VCSELs is available in U.S. Pat. No. 5,256,596 entitled "Top Emitting VCSEL with Implant", issued 26 Oct. 1993 and assigned to the same assignee.

A dielectric layer 34 is formed on the surfaces of mesas 30 and 32. Dielectric layer 34 is patterned to define an emission window 36 for VCSEL 10 and an emission window 38 for VCSEL 12. Also, a portion of the upper surface of mirror stack 16 adjacent each of mesas 30 and 32 is exposed. A first contact 40 for VCSEL 10 is formed on mesa 30 in contact with upper mirror stack 20 and a first contact 42 for VCSEL 12 is similarly formed on mesa 32 in contact with upper mirror stack 20. A second contact 44 for VCSEL 10 is formed on the upper surface of mirror stack 16 adjacent mesa 30 and a second contact 46 for VCSEL 12 is formed on the upper surface of mirror stack 16 adjacent mesa 32. It will of course be understood that in some applications a common second contact might be used for both VCSELs 10 and 12.

The quantum wells of active regions 18 in VCSELs 10 and 12 produce photons (light) in accordance with a well known phenomenon when properly energized by electrical current applied thereacross. In general, the greater the current applied to active regions 18, the greater the number of photons generated. The photons are reflected by mirror stack 16 and 20 in each of VCSELs 10 and 12 to produce the well known lasing effect that ultimately produces the emitted light. Since the active regions 18 and mirror stacks 16 and 20 of VCSELs 10 and 12 are identical, by connecting VCSELs 10 and 12 in parallel to provide equal currents, the emissions are identical.

Figure 2:
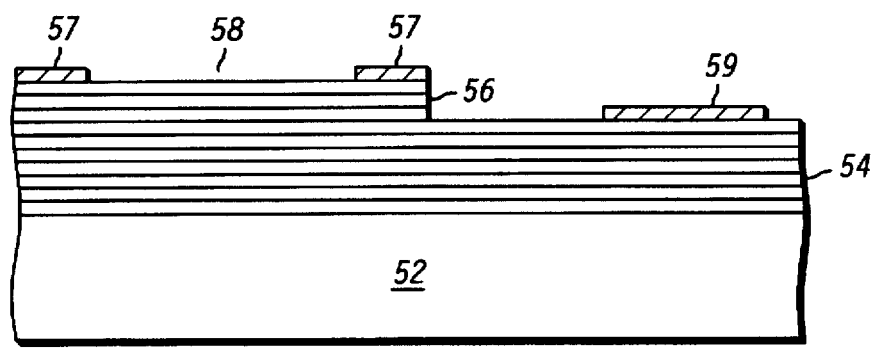
FIG. 2 is a simplified cross-sectional view of a photodiode.

Turning now to FIG. 2, a photodiode generally designated 50 is illustrated. Photodiode 50 includes a second substrate 52 on which a mirror stack 54 is epitaxially grown. An active region 56 is epitaxially formed on the upper surface of mirror stack 54. A portion of active region 56 is etched to expose a surface of mirror stack 54. A first electrical contact 57 is formed on the surface of active region 56 defining a light receiving window 58, and a second electrical contact 59 is formed on the exposed surface of mirror stack 54. Second electrical contact 59 could also be formed on the lower surface of substrate 52, if convenient. It should be understood that while a mirror stack can be utilized to improve the efficiency of photodiode 50, in many instances only an active region and cladding layers may be employed.

Figure 3:
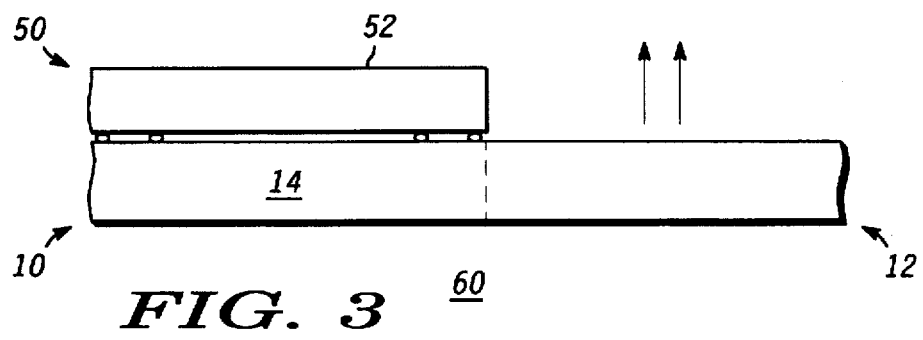
FIG. 3 is a simplified cross-sectional view of a flip chip power monitoring system in accordance with the present invention.
Figure 4:
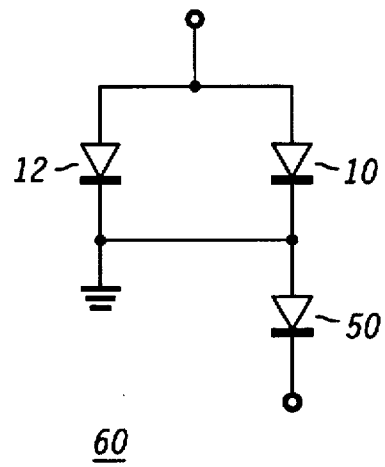
FIG. 4 is a schematic diagram of the system of FIG. 3.

Referring now to FIG. 3, a power monitoring system generally designated 60 is illustrated. System 60 includes substrate 52 flip chip mounted onto substrate 14. Substrate 52 includes a monitoring device which as described previously, in this embodiment is photodiode 50. Substrate 52 is positioned on substrate 14 so as to position photodiode 50 in optical alignment with VCSEL 10, that is window 58 of photodiode 50 is optically aligned with window 36 of VCSEL 10 so that emissions from window 36 enter directly into window 58. The flip chip mounting can be accomplished utilizing any of the well known semiconductor technologies, such as bump bonding, conductive epoxy, etc. A schematic diagram of system 60 is illustrated in FIG. 4.

Figure 5:
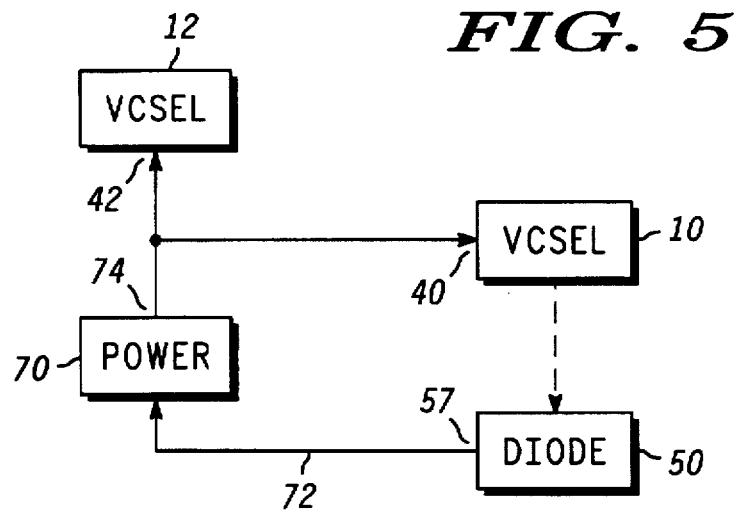
FIG. 5 is a simplified block diagram of an automatic power controlled vertical cavity surface emitting laser.

Referring specifically to FIG. 5, power monitoring system 60 can also include a power control device 70 having a control input 72 and a power output 74. Control input 72 is coupled to contact 57 of photodiode 50, and power output 74 is coupled to contacts 40 and 42 of VCSELs 10 and 12, respectively. In operation, emissions from VCSELs 10 and 12 are substantially identical. The Emissions from VCSEL 10 are monitored by photodiode 50 to develop a control signal, which is utilized to control power to both VCSELs 10 and 12 through power control device 70. Since the emissions from VCSELs 10 and 12 are identical, the emissions from either VCSEL can be monitored to establish the characteristics of the emissions from the other VCSEL.

Thus a system for monitoring the emissions of a VCSEL utilizing a power monitor has been disclosed. Further disclosed is a power monitoring system which will automatically control the emissions of the VCSEL. The power monitor system and automatic power control is inexpensive and easily fabricated.

Various modifications and changes to the embodiment herein chosen for purposes of illustration will readily occur to those skilled in the art. The foregoing is given by way of example only. Other modifications and variations may be made by those skilled in the art without departing from the scope of the invention as defined by the following claims.

Having fully described and disclosed the present invention and preferred embodiments thereof in such clear and concise terms as to enable those skilled in the art to understand and practice same, the invention claimed is:

1. A power monitoring system for producing an output light emission, the system comprising:
  a first vertical cavity surface emitting laser generating a first emission as the output light emission, the first vertical cavity surface emitting laser having first and second terminals;

a second vertical cavity surface emitting laser generating a second emission generally identical to the first emission, the second vertical cavity surface emitting laser having first and second terminals with the second terminals of each of the first and second vertical cavity surface emitting lasers being connected together;

a monitor mounted to receive the second emission from the second vertical cavity surface emitting laser, the monitor having an output terminal; and a power control device having a control input and a power output, the control input being coupled to the output terminal of the monitor and the power output being coupled to the first terminals of the first and second vertical cavity surface emitting lasers for supplying power thereto.

2. A power monitoring system as claimed in claim 1 wherein the first and second vertical cavity surface emitting lasers are formed on a common first substrate.

3. A power monitoring system as claimed in claim 2 wherein the first and second vertical cavity surface emitting lasers are substantially identical.

4. A power monitoring system as claimed in claim 3 wherein the monitor is a photodiode.

5. A power monitoring system as claimed in claim 4 wherein the photodiode is formed on a second substrate, the second substrate being flip chip mounted on the first substrate and in optical alignment with the second emission.

6. A power monitoring system comprising:

a first substrate having a first vertical cavity surface emitting laser and a second vertical cavity surface emitting laser formed thereon and generally identical; and a second substrate having a photodiode formed thereon, the second substrate being flip chip mounted on the first substrate with the photodiode in optical alignment with the second vertical cavity surface emitting laser.

7. A power monitoring system as claimed in claim 6 further including a power control device having a control input and a power output, the control input coupled to an output terminal of the photodiode and the power output coupled to the first and second vertical cavity surface emitting lasers.

8. A method of fabricating a power monitoring system comprising the steps of:

providing a first substrate and forming a first vertical cavity surface emitting laser and a second vertical cavity surface emitting laser thereon with generally identical characteristics;

providing a second substrate and forming a photodiode thereon; and flip chip mounting the second substrate on the first substrate such that the photodiode is in optical alignment with the second vertical cavity surface emitting laser.

9. A method as claimed in claim 8 further including a step of utilizing an output of the photodiode to control emissions of the first and second vertical cavity surface emitting lasers.

* * * * *